(12) United States Patent
Rupp et al.

(10) Patent No.: US 8,895,422 B2
(45) Date of Patent: Nov. 25, 2014

(54) PRODUCTION OF AN INTEGRATED CIRCUIT INCLUDING ELECTRICAL CONTACT ON SIC

(71) Applicant: Infineon Technologies Austria AG, Villach (AT)

(72) Inventors: Roland Rupp, Lauf (DE); Thomas Gutt, Taufkirchen (DE); Michael Treu, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/802,875

(22) Filed: Mar. 14, 2013

(65) Prior Publication Data

US 2013/0193449 A1 Aug. 1, 2013

Related U.S. Application Data

(62) Division of application No. 11/924,093, filed on Oct. 25, 2007, now Pat. No. 8,450,196.

(30) Foreign Application Priority Data

Oct. 25, 2006 (DE) .................. 10 2006 050 360

(51) Int. Cl.
*H01L 21/28* (2006.01)
*H01L 29/66* (2006.01)
*H01L 29/872* (2006.01)
*H01L 21/268* (2006.01)
*H01L 21/04* (2006.01)
*H01L 29/47* (2006.01)
*H01L 29/16* (2006.01)

(52) U.S. Cl.
CPC ...... *H01L 21/0495* (2013.01); *H01L 29/66143* (2013.01); *H01L 29/872* (2013.01); *H01L 21/2683* (2013.01); *H01L 29/47* (2013.01); *H01L 29/1608* (2013.01)
USPC ............. 438/572; 257/E21.054; 257/E21.065

(58) Field of Classification Search
CPC ................... H01L 21/02354; H01L 21/02378; H01L 21/02675; H01L 21/0445; H01L 21/428; H01L 29/1608; H01L 29/66053; H01L 29/66075; H01L 21/0495; H01L 29/47; H01L 29/66143
USPC ............. 257/77, E21.054, E21.065; 438/572
See application file for complete search history.

(56) References Cited

U.S. PATENT DOCUMENTS 5,508,209 A 4/1996 Zhang et al.
5,980,265 A 11/1999 Tischler
(Continued)

FOREIGN PATENT DOCUMENTS

WO 2005020308 3/2005

OTHER PUBLICATIONS

Office Action mailed Oct. 1, 2009 in U.S. Appl. No. 11/924,093.
(Continued)

*Primary Examiner* — Colleen A Matthews
*Assistant Examiner* — Colleen E Snow
(74) *Attorney, Agent, or Firm* — Dicke, Billig & Czaja, PLLC (57) ABSTRACT

Production of an integrated circuit including an electrical contact on SiC is disclosed. One embodiment provides for production of an electrical contact on an SiC substrate, in which a conductive contact is produced on a boundary surface of the SiC substrate by irradiation and absorption of a laser pulse on an SiC substrate.

7 Claims, 6 Drawing Sheets

(56) References Cited

U.S. PATENT DOCUMENTS

| | | |
|---|---|---|
| 6,124,081 A | 9/2000 | Kishimura |
| 6,358,806 B1 * | 3/2002 | Puchner .................. 438/308 |
| 6,706,576 B1 | 3/2004 | Ngo et al. |
| 6,770,508 B2 | 8/2004 | Nakashima et al. |
| 7,265,388 B2 * | 9/2007 | Fukuda et al. ............... 257/77 |
| 7,271,045 B2 | 9/2007 | Prince et al. |
| 7,547,578 B2 | 6/2009 | Agarwal et al. |
| 7,732,739 B2 * | 6/2010 | Shibagaki et al. ........... 219/390 |
| 2008/0017947 A1 | 1/2008 | Treu |
| 2009/0315036 A1 | 12/2009 | Zhang et al. |

OTHER PUBLICATIONS

Office Action mailed Mar. 30, 2010 in U.S. Appl. No. 11/924,093.
Final Office Action mailed Sep. 17, 2010 in U.S. Appl. No. 11/924,093.
Office Action mailed Jul. 6, 2011 in U.S. Appl. No. 11/924,093.
Final Office Action mailed Dec. 20, 2011 n U.S. Appl. No. 11/924,093.

* cited by examiner

PRODUCTION OF AN INTEGRATED CIRCUIT INCLUDING ELECTRICAL CONTACT ON SIC

CROSS-REFERENCE TO RELATED APPLICATIONS

This Utility Patent Application is a divisional of U.S. patent application Ser. No. 11/924,093, filed Oct. 25, 2007, which claims priority to German Patent Application No. DE 10 2006 050 360.0 filed on Oct. 25, 2006, both of which are incorporated herein by reference.

BACKGROUND

A method is described for production of an electrical contact on SiC.

Silicon carbide (SiC) represents a highly promising semiconductor material, in one embodiment for power and very high frequency electronics, because of its excellent physical characteristics. It is distinguished in comparison to silicon, which has become industrially established as a semiconductor material, by an electrical breakdown field strength that is approximately 10 times greater, as well as band gap and thermal conductivity values that are about 3 times greater, therefore allowing particular advantages with respect to power losses, power density and thermal load capacity. During the development of electronic components composed of SiC substrates, such as SiC Schottky diodes or SiC-MOSFETs (SiC Metal Oxide Semiconductor Field Effect Transistors), conductive contacts must be formed on the SiC substrates in order to make electrical contact with and to gain access to components produced in these substrates. A contact-formation process carried out by heat-treatment of the SiC substrate, for example an oven process or an RTP (Rapid Thermal Processing) process results in a temperature budget which can lead to restrictions in the process integration for formation of the semiconductor component, since there may be further processes which are adversely influenced by such a high temperature budget.

A production method for an electrical contact on an SiC substrate which allows more process flexibility would be desirable.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The views illustrated in the following figures are intended to illustrate a number of embodiments, and are not illustrated to scale. Similar or corresponding elements in the cross-sectional views are provided with the same reference symbols. The sequential processes illustrated in the figures in the form of schematic cross-sectional views may be preceded or followed by further processes. In the same way, further processes may be introduced between two process stages (for example the process stages in FIGS. 1A and 1B) which are illustrated as being sequential.

One embodiment provides a method for production of an integrated circuit including an electrical contact on an SiC substrate having the features that an SiC substrate is provided, a metal layer is formed on one surface of the SiC substrate, and the metal layer is irradiated with a laser pulse such that a metal silicide is formed by thermal action on a boundary surface to the SiC substrate.

By way of example, the SiC substrate may be a preprocessed SiC substrate. Elements of a semiconductor component to be formed can therefore have been produced in or else on the SiC substrate at this stage, for example well zones formed within the SiC substrate. The thermal formation of the metal silicide composed of the silicon of the SiC substrate and a metal element of the metal layer is created by absorption of the laser pulse, thus resulting in a temperature increase which causes a reaction between silicon and the metal of the metal layer, to form the metal silicide. During this process, carbon deposits, which contribute to the formation of the conductive contact, can also be formed as a reaction product of the silicide formation, on the boundary surface.

The use of the laser pulse to form the silicide results in local heating associated with very short process times, in the order of magnitude of microseconds or less. The temperature budget causing the formation of silicide with the laser pulse is several orders of magnitude less than the temperature budget for RTP and oven processes. This allows one or more advantages in terms of the formation of the conductive contact, as will become evident from the following statements. The carbon deposits as described above are produced during the silicide formation, and are used to form the conductive contact. The carbon contributes to the formation of the conductive contact only on the boundary surface to the SiC substrate. As the temperature budget increases for the silicide formation or subsequent processes, this results in seed formation of carbon deposits beyond the boundary surface in a contact metal area. The carbon that is bonded there is worthless in terms of reducing the contact resistance, and can lead to the creation of weak points and thus to detachment of the contact metal, which can adversely affect the solder capabilities of chips resulting from the SiC substrate. In this context, it is particularly advantageous for the temperature budget to be as low as possible after formation of the electrical contact.

In a further embodiment, a layer containing silicon is formed on the surface of the SiC substrate before the formation of the metal layers, and the metal layer is subsequently produced on the layer which contains silicon. By way of example, the layer which contains silicon may be formed exclusively or predominantly from layers formed from silicon, such as polycrystalline silicon, amorphous silicon or doped forms of it. The layer which contains silicon may likewise also be a connecting layer such as a metal silicide in which silicon represents a connection component. The layer which contains silicon is particularly suitable for controlling the metal silicide formation on the boundary surface to the SiC substrate, as well as the carbon deposits.

According to a further embodiment, the wavelength of the laser pulse is chosen to be in a range from 100 nm to 1000 nm. Although the wavelength is chosen taking into account further parameters, for example taking into account the thickness of a layer structure on the SiC substrate, the pulse length and the pulse energy, the wavelength is chosen in one embodiment with respect to the absorption characteristics of the layer structure and of the SiC substrate, as well as the reflection and transmission behavior of the multilayer system. By way of example, it is possible to use an excimer laser with a wavelength of 307 nm.

In a further embodiment, the thickness of a layer structure formed on the SiC surface for irradiation with the laser pulse is in the range from 10 to 50 nm. The layer structure can therefore be formed not only from the metal layer on its own but also from the layer which contains silicon plus the metal layer. In a further embodiment, the thickness of the layer structure is chosen to be in the range from 15 to 20 nm.

In a further embodiment, the metal layer includes at least one of the elements nickel, molybdenum, cobalt and titanium. However, in addition to these metals, it is also possible to use further metals which form a suitable metal silicide.

A further embodiment provides a method for production of an electrical contact on an SiC substrate having the features of the SiC substrate being provided with an exposed SiC surface, the exposed SiC surface being irradiated with a laser pulse such that the SiC substrate loses silicon by thermal action on the surface, and a carbon structure remaining, and a contact reinforcement structure being formed on the carbon structure.

This embodiment allows the formation of a conductive contact on an SiC surface without previous metallization. In this case, the energy introduced from the laser pulse into the SiC substrate as a result of the absorption of the laser pulse leads to vaporization of silicon from the SiC crystal lattice. At high surface temperatures such as these of up to more than 1400° C., silicon has a higher partial pressure than carbon. A carbon structure which remains in this case has, for example, an sp2 bonding state, for the formation of conductive contacts, as a result of the bonding conditions in the SiC. The contact reinforcement structure formed on this can be used to provide conductive metallization, which can be soldered, without any further heat-treatment. By way of example, a metal stack composed of Ti/Ni/Ti/Ag can be used as the contact reinforcement structure. Further metal individual-layer or multilayer systems may, of course, be used as the contact reinforcement structure.

In a further embodiment, the laser pulse is chosen to have a wavelength in the range from 100 nm to 350 nm. A short laser wavelength such as this leads to suitable absorption of the laser energy on the SiC surface, that is to say where very high surface temperatures are required in order to remove the silicon from the SiC crystal lattice.

In a further embodiment, a pulse duration in the range from 20 ns to 2000 ns is chosen. When shortening the pulse duration, care must be taken to ensure that vaporization of irradiated material, and therefore undesirable contamination of the laser system, are avoided.

In a further embodiment, the pulse energy is chosen to be in the range from $0.5$ J/cm$^2$ to $8$ J/cm$^2$. The pulse energy is chosen taking account of the material-specific absorption characteristics of the SiC substrate and of the layer structure formed on it, as well as the temperature to be achieved. With regard to the above embodiments, on the one hand a metal-silicide formation temperature must be achieved on the boundary surface towards the SiC substrate, or else a comparatively high temperature must be achieved for vaporization of silicon from the SiC structure in the surface area of the SiC substrate. According to a further embodiment, the pulse energy is chosen to be in the range from $2$ J/cm$^2$ to $4$ J/cm$^2$.

In a further embodiment, the electrical contact is formed on a front face and/or rear face of the SiC substrate. A front-face contact may be formed before the formation of a rear-face contact, or vice versa. Further processes, for example for definition of a semiconductor component in the SiC substrate, may be carried out before, between or after these processes for formation of the electrical contacts.

A further embodiment provides a method for production of a semiconductor component having the features of an SiC semiconductor substrate being provided and processes being carried out in order to produce the semiconductor component, wherein the processes include production of an electrical contact according to one of the embodiments described above.

The semiconductor component to be formed may, for example, be in the form of a component for high-power, high-temperature and high-frequency applications, for example an SiC Schottky diode, an SiC-MOSFET or SiC-JFET (Junction Field Effect Transistor). However, a large number of further SiC semiconductor components can be produced in addition to the component types mentioned by way of example, with each semiconductor component type being distinguished by a sequence of characteristic processes. However, an electrical contact is formed with the aid of the laser pulse method described above, at least on one surface of the SiC semiconductor substrate.

According to one embodiment, the SiC substrate is thinned from the rear face before the formation of an electrical rear-face contact. Risk of fracture of the SiC substrate can be avoided by defining the electrical rear-face contact with a low thermal budget by using the laser pulse method as described above, at the end of the process chain for formation of the semiconductor component. Owing to the comparatively low thermal budget for the laser pulse method, and the process flexibility achieved in this way, it is possible to form the rear-face contact at the end of the entire process since processes carried out prior to this, for example relating to edge passivation by polyimide or of a metal on the front face, are not adversely affected owing to the restricted and local thermal budget in the laser pulse method. This embodiment therefore makes it possible, in one embodiment, to carry out a thin wafer process for vertical SiC components which require a conductive rear-face contact. In the case of vertical components such as these, the substrate resistance contributes significantly to the total resistance, particularly for voltage classes below 1000 V. Reducing the substrate thickness from about 350 μm as at present therefore makes it possible to produce SiC components with better performance features. Reducing the substrate thickness to values of less than 150 82 m leads to a considerable improvement in the electrical characteristics of the vertical SiC components.

In a further embodiment relating to the production of a semiconductor component, the electrical contact is formed on the front face by local irradiation of the metal layer with the laser pulse. The metal layer on the surface of the SiC substrate is accordingly only partially converted to the metal silicide.

In order to achieve such local irradiation of the metal layer with the laser pulse, it is possible to use one or a combination of the following processes, of scanning of the SiC substrate, use of reticles in the beam path, use of reflector layers and/or use of contact masks.

According to one embodiment, the semiconductor component corresponds to a

Schottky diode, and a rear-face contact is produced after formation of a Schottky junction. Although the temperature budget of subsequent processes is restricted after the formation of the Schottky contact, in order to avoid adverse affects on the Schottky contact, a rear-face contact can be produced subsequently by use of the laser pulse method as described in this document.

According to a further embodiment, the semiconductor component corresponds to a merged pn-Schottky diode. In this case, a Schottky metal on a front face of the SiC substrate is irradiated locally with the laser pulse in order to produce the electrical contact. This makes it possible on the one hand to produce areas with a conductive character, and on the other hand further areas with Schottky characteristics, with only one metallization process on the front face. This embodiment is therefore advantageous in comparison to a method including the processes of metallization, local lift-off, annealing and renewed metallization.

Figure 1A:
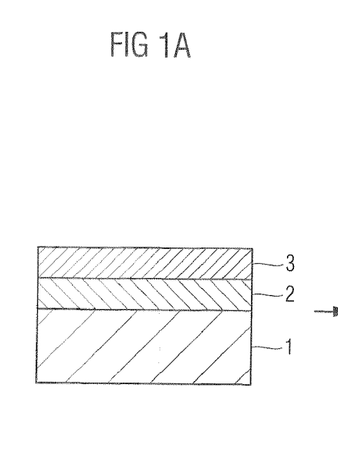
FIGS. 1A to 1C illustrate schematic cross-sectional views of an SiC substrate during the production of an electrical contact, according to one embodiment.

FIG. 1A illustrates a schematic cross-sectional view of an SiC substrate 1 at the start of the process of forming an electrical contact, according to one embodiment. A layer containing silicon is applied to the SiC substrate 1 and is used to control subsequent silicide formation. The layer which contains silicon may, for example, be formed from polycrystalline or amorphous silicon, or else from compounds containing silicon. A metal layer 3 is applied to the layer 2 which contains silicon. By way of example, the metal layer 3 may contain one of the elements Ni, No or Ti. However, it is also possible to use other metals which are suitable for formation of a metal silicide.

Figure 1B:
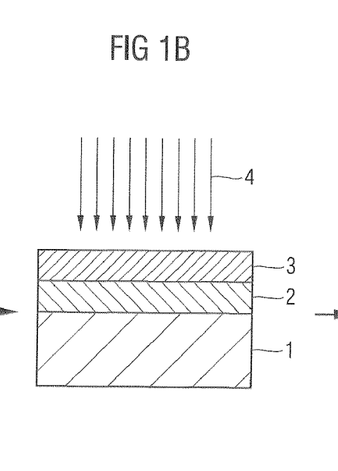

FIG. 1B illustrates a schematic cross-sectional view of a later process stage in this embodiment. In this case, the metal layer 3 is being irradiated with a laser pulse 4.

Figure 1C:
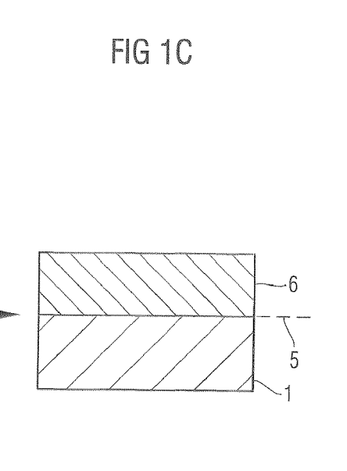

The metal layer 3 is irradiated with the laser pulse 4 such that a metal silicide 6, as is illustrated in the schematic cross-sectional view in FIG. 1C, is formed by thermal action on a boundary surface 5 to the SiC substrate.

The formation of the metal silicide is achieved by the introduction of energy by absorption of the laser pulse 4 leading to a temperature increase above a silicide-formation temperature on the boundary surface 5 to the SiC substrate 1. A number of parameters can be set such that they can be matched to one another in order to achieve the silicide-formation temperature by absorption of the laser pulse. The parameters used include, for example the wavelength of the laser pulse 4, the thickness of the layer structure including the layer 2 which contains silicon and the metal layer 3, the pulse duration and the pulse energy. For example, the wavelength of the laser pulse can be chosen to be in a range from 100 nm to 1000 nm, with the thickness of the layer structure being in the range from 10 nm to 50 nm, the pulse duration being in the range from 20 ns to 2000 ns, and the pulse energy being in the range from 0.5 $J/cm^2$ to 8 $J/cm^2$. Because of the multiplicity of parameter combinations, one example will be mentioned, with a wavelength of 307 nm (for example excimer laser), a layer structure thickness of 15 to 20 nm, a pulse duration of 200 ns and a pulse energy of 3 to 4 $J/cm^2$ in conjunction with nickel as the metal layer 3, and polysilicon as the layer 2 which contains silicon.

Figure 2A:
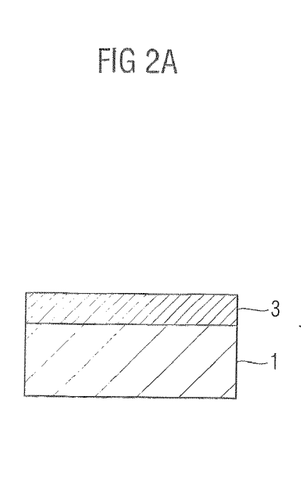
FIGS. 2A to 2C illustrate schematic cross-sectional views of an SiC substrate during the production of an electrical contact.

FIG. 2A illustrates a schematic cross-sectional view of a process stage at the start of the formation of an electrical contact on an SiC substrate, according to a further example. This example differs from the embodiment that has been explained with reference to FIGS. 1A to 1C in one embodiment in that the metal layer 3 is supplied directly to the SiC substrate 1, so that there is no layer 2 containing silicon in this embodiment. The process stages of irradiation with the laser pulse, as illustrated in the schematic cross-sectional views in FIGS. 2B and 2C for formation of the metal silicide 6 on the boundary surface 5 to the SiC substrate 1 correspond in principle to the processes illustrated in FIGS. 1B and 1C, and will not be explained in detail once again at this point.

Figure 3A:
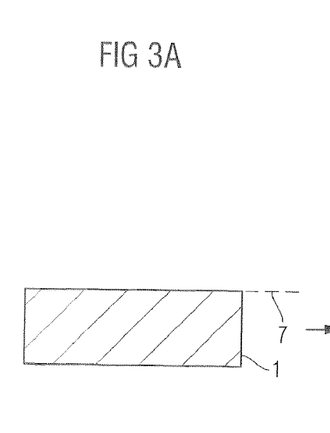
FIGS. 3A to 3C illustrate schematic cross-sectional views of an SiC substrate during the production of a semiconductor component according to a further embodiment.

FIG. 3A illustrates a schematic cross-sectional view of a process stage at the start of the formation of an electrical contact on the SiC substrate 1, according to a further embodiment. In this case, the SiC substrate 1 has an exposed SiC substrate surface 7.

Figures 3B, 3C:
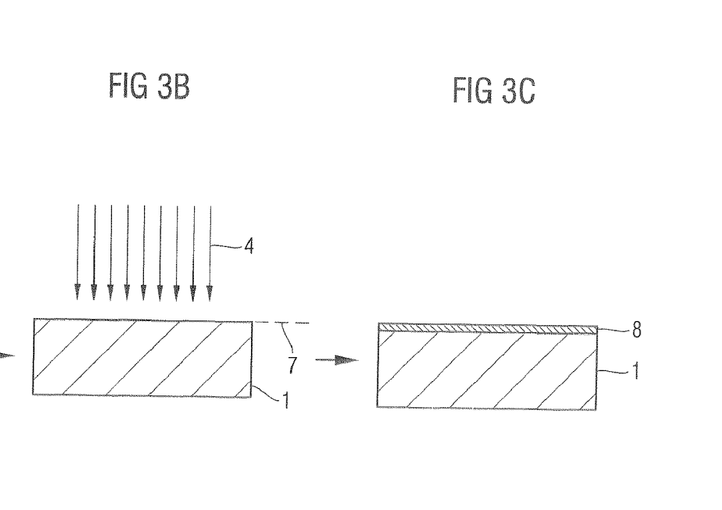

In the subsequent process stage illustrated as a schematic cross-sectional view in FIG. 3B, the exposed SiC substrate surface 7 is irradiated with the laser pulse 4.

In this case, the exposed SiC substrate surface 7 is irradiated in such a way that the SiC substrate 1 loses silicon by thermal action on the surface 7, and a carbon structure 8 remains. This is illustrated in the schematic cross-sectional view in FIG. 3C. In this embodiment, the energy must be introduced into the exposed SiC substrate surface 7 such that silicon vaporizes from the SiC crystal lattice, and a carbon structure remains as the carbon structure that forms the electrical contact. A contact reinforcement structure, for example a Ti/Ni/Ti/Ag stack or further layers or layer sequences that are suitable for this purpose, can be applied to the carbon structure 8 (not illustrated). In conjunction with this embodiment, it should be noted that, in one embodiment, short wavelengths of the laser pulse 4 lead to suitable absorption of the laser energy on the exposed SiC substrate surface 7. If the laser pulse wavelength is increased, it should be remembered that the absorption in the vicinity of the surface will decrease, and will be shifted increasingly into the depth of the SiC substrate 1.

A further embodiment will be explained in the following text, in which the laser pulse method illustrated in FIGS. 3A to 3C for formation of a rear-face contact is integrated in a process for manufacturing a semiconductor component. It should be noted that the embodiments explained in conjunction with FIGS. 1A-1C and FIGS. 2A-2C can, of course, also be used to form the rear-face contact.

Figure 4A:
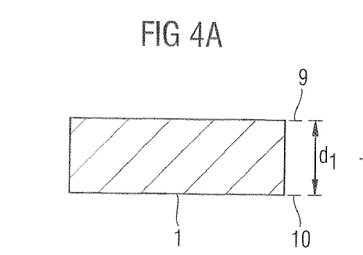
FIGS. 4A to 4E illustrate schematic cross-sectional views of an SiC substrate during the production of a semiconductor component according to a further embodiment.

FIG. 4A illustrates a schematic cross-sectional view of the SiC substrate at the start of the manufacturing chain. The SiC substrate 1 has a thickness $d_1$, as well as a front face 9 and a rear face 10.

Figure 4B:
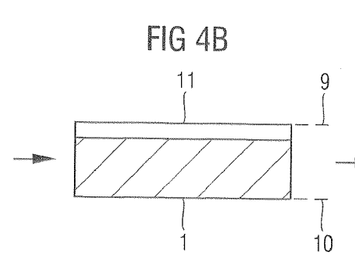
Figure 4C:
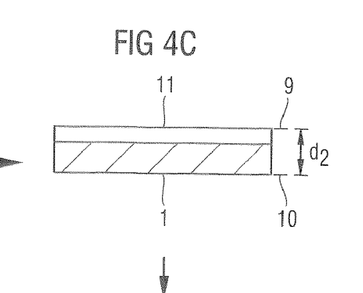

Processes relating to the manufacture of the semiconductor component are carried out first, over the front face 9. This is illustrated in a highly simplified form, in the schematic cross-sectional view in FIG. 4B, in the form of a component-specific structure 11 on the front face 9. The component-specific structure 11 may include well zones formed within the SiC substrate, or else regions formed on the substrate 1, such as a Schottky contact region or an isolation or wiring area. After the formation of the component-specific structure 11 on the front face 9 of the SiC substrate 1, the substrate 1 is thinned from the rear face 10 starting from the thickness $d_1$ to a thickness $d_2$, as is illustrated in the schematic cross-sectional view in FIG. 4C.

Figure 4D:
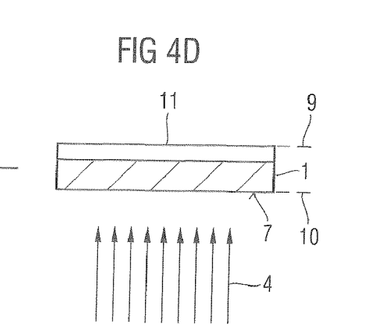

The electrical contact is now formed on the rear face 10 with the aid of the method explained in FIGS. 3A to 3C (FIG. 4D). Corresponding to the process stages illustrated schematically in FIGS. 3B and 3C, the exposed SiC substrate surface 7 is once again irradiated in this case on the rear face 10 of the SiC substrate 1 with the laser pulse 4 such that the SiC substrate 1 loses silicon by thermal action on the rear face 10, and a carbon structure 8 remains.

Figure 4E:
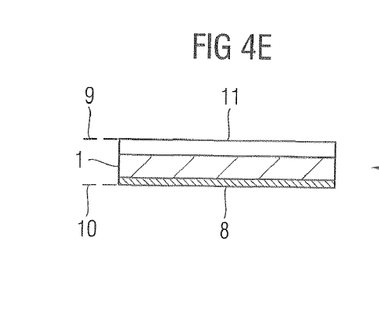

The carbon structure 8, which forms the conductive contact, is illustrated in the schematic cross-sectional view in FIG. 4E.

Further processes, for example relating to the formation of a contact reinforcement structure, may follow the process stage illustrated in FIG. 4E.

Figure 5A:
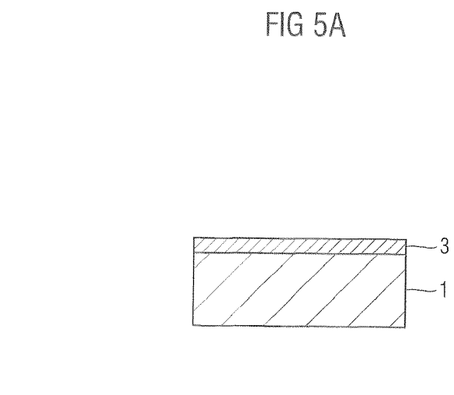
FIGS. 5A to 5C illustrate schematic cross-sectional views of an SiC substrate during the production of an integrated circuit including a semiconductor component according to a further embodiment.

FIG. 5A illustrates a schematic cross-sectional view of an SiC substrate 1 at the start of the formation of an electrical contact on the SiC substrate 1, according to a further embodiment. In this embodiment, the processes carried out are substantially the same as those in the embodiment illustrated in FIGS. 2A to 2C. A metal layer 3 is thus first of all applied to the SiC substrate 1, see FIG. 5A.

Figure 2B:
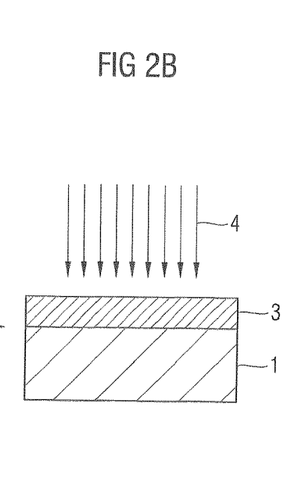
Figure 2C:
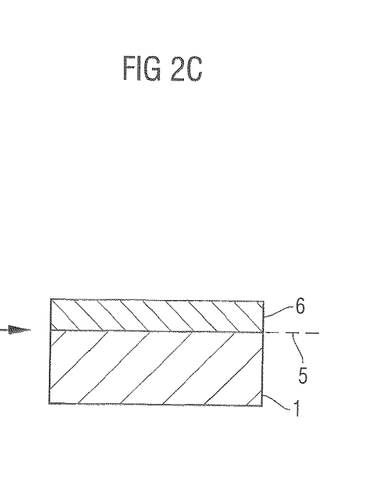
Figure 5B:
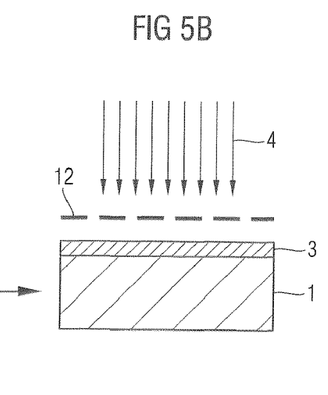

The process stage in the embodiment illustrated in FIG. 5B differs from the irradiation of the SiC substrate 1 with the laser pulse 4 according to the embodiment illustrated in FIG. 2B in that the laser pulse 4 irradiates the metal layer 3 in localized areas. A reticle 12 is used in the beam path, for this purpose.

Figure 5C:
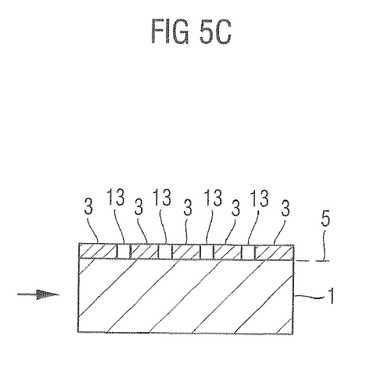

As can be seen from the schematic cross-sectional view, as illustrated in FIG. 5C, of the SiC substrate 1 after irradiation with the laser pulse 4, the reticle 12 in the beam path makes it possible to form localized areas composed of metal silicide 13. Areas of the metal layer 3 as well as the localized areas composed of metal silicide 13 which form the conductive contact therefore remain on the surface 5 of the SiC substrate 1. This embodiment is suitable, for example, for the formation of merged pn-Schottky diodes, which require not only conductive contact areas but also areas with Schottky characteristics on the front face. This embodiment makes it possible to produce such merged pn-Schottky diodes with only one metallization process, since the metal layer 3 is used not only to form the localized areas composed of metal silicide 13, that is to say the conductive contents, but also the remaining areas, that is to say those which have not been converted, of the metal layer 3 as the Schottky contact layer.

Local irradiation of the SiC substrate 1 can be achieved, for example, by scanning, the use of reticles in the beam path, reflector layers and/or contact masks.

Figure 6:
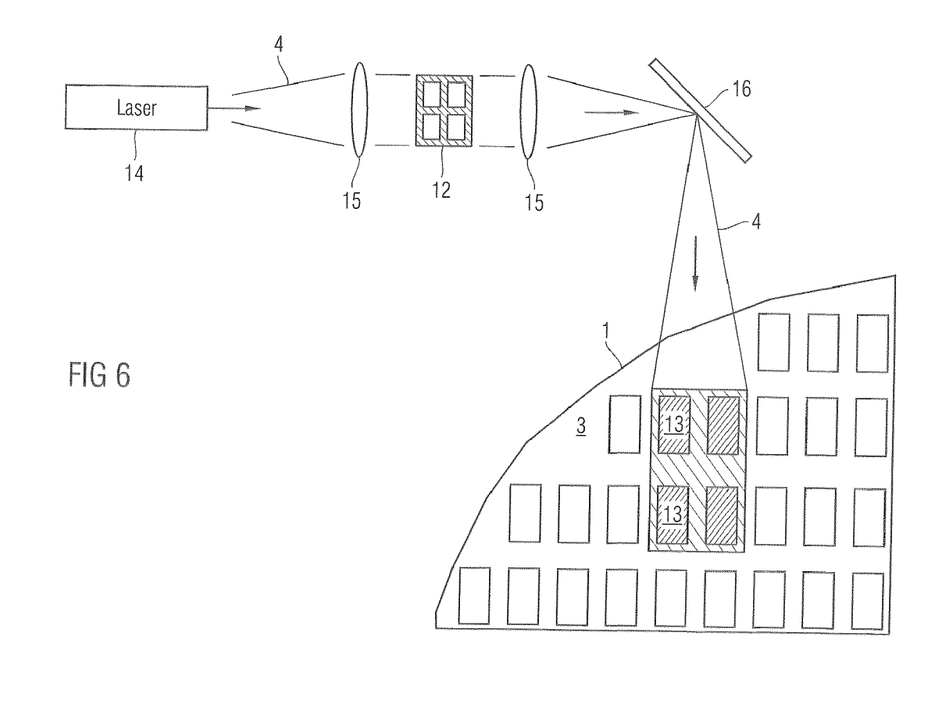
FIG. 6 illustrates a schematic illustration of the local irradiation of a metal layer with a laser pulse.

FIG. 6 illustrates a schematic illustration of an illumination system for local irradiation of the SiC substrate 1. In this case, the laser pulse 4 is produced by a laser source 14, and is passed to the metal layer 3 on the SiC substrate 1 via an imaging system which contains the reticle 12 and additionally has lenses 15 and a deflection mirror 16. A multiplicity of such localized areas composed of metal silicide 13 can be produced by scanning the SiC substrate 1.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing an integrated circuit including an electrical contact on an SiC substrate comprising:
    providing the SiC substrate with an exposed SiC surface;
    irradiating the exposed SiC surface with a laser pulse such that the SiC substrate loses silicon by thermal action on the surface, and a carbon structure remains; and
    forming a contact reinforcement structure on the carbon structure.

2. The method of claim 1, comprising wherein the wavelength of the laser pulse is in the range from 100 nm to 350 nm.

3. The method of claim 1, comprising choosing the pulse duration to be in the range from 20 ns to 2000 ns.

4. The method of claim 1, comprising choosing the pulse energy to be in the range from 0.5 J/cm2 to 8 J/cm2.

5. The method of claim 1, comprising choosing the pulse energy to be in the range from 2 J/cm2 to 4 J/cm2.

6. The method of claim 1, comprising forming the electrical contact on a front face and/or the rear face of the SiC substrate.

7. The method of claim 1, wherein forming a contact reinforcement structure provides a conductive metallization without further heat treatment.

* * * * *